US012795931B2

(12) United States Patent
Eom

(10) Patent No.: US 12,795,931 B2
(45) Date of Patent: Nov. 10, 2026

(54) 3D NONVOLATILE MEMORY DEVICE INCLUDING FIRST AND SECOND PASS TRANISTORS COUPLING GLOBAL WORD LINES TO LOCAL LINES

(71) Applicant: SK hynix Inc., Icheon-si (KR)

(72) Inventor: Dae Sung Eom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 444 days.

(21) Appl. No.: 18/473,092

(22) Filed: Sep. 22, 2023

(65) Prior Publication Data

US 2024/0357823 A1 Oct. 24, 2024

(30) Foreign Application Priority Data

Apr. 18, 2023 (KR) ........................ 10-2023-0050553

(51) Int. Cl.
*H10B 43/35* (2023.01)
*H10B 41/27* (2023.01)
*H10B 41/35* (2023.01)
*H10B 43/27* (2023.01)

(52) U.S. Cl.
CPC ............. *H10B 43/35* (2023.02); *H10B 41/27* (2023.02); *H10B 41/35* (2023.02); *H10B 43/27* (2023.02)

(58) Field of Classification Search
CPC ........ H10B 43/35; H10B 41/35; H10B 41/27; G11C 8/14; G11C 7/18
See application file for complete search history.

(56) References Cited

U.S. PATENT DOCUMENTS

| | | | | |
|---|---|---|---|---|
| 2008/0084729 A1* | 4/2008 | Cho | ........................ | H10D 88/01 365/72 |
| 2018/0268892 A1* | 9/2018 | Kim | ........................ | G11C 8/08 |
| 2023/0106571 A1* | 4/2023 | Shen | ........................ | G11C 8/14 257/314 |

FOREIGN PATENT DOCUMENTS

| | | | |
|---|---|---|---|
| KR | 1020190128895 A | 11/2019 |
| KR | 1020220050665 A | 4/2022 |

* cited by examiner

*Primary Examiner* — Davienne N Monbleau
*Assistant Examiner* — Emily Farmer
(74) *Attorney, Agent, or Firm* — WILLIAM PARK AND ASSOCIATES LTD.

(57) ABSTRACT

Provided herein is a semiconductor memory device. The semiconductor memory device includes a stacked body, and first pass transistors and second pass transistors configured to couple global word lines to local lines, wherein any one of the plurality of conductive lines is a block select line, and gates of the first pass transistors and the second pass transistors are coupled to the block select line.

20 Claims, 10 Drawing Sheets

3D NONVOLATILE MEMORY DEVICE INCLUDING FIRST AND SECOND PASS TRANISTORS COUPLING GLOBAL WORD LINES TO LOCAL LINES

CROSS-REFERENCE TO RELATED APPLICATION

The present application claims priority under 35 U.S.C. § 119 (a) to Korean patent application number 10-2023-0050553 filed on Apr. 18, 2023, in the Korean Intellectual Property Office, the entire disclosure of which is incorporated by reference herein.

BACKGROUND

1. Technical Field

Various embodiments of the present disclosure generally relate to an electronic device, and more particularly, to an electronic device including a semiconductor memory device.

2. Related Art

A nonvolatile memory device is a memory device which retains stored data even when the supply of power is interrupted. Recently, as a two-dimensional (2D) nonvolatile memory device in which memory cells are formed on a substrate in a single layer is reaching its physical scaling limit (e.g., degree of integration), a three-dimensional (3D) nonvolatile memory device including memory cells vertically stacked on a substrate has been proposed.

The 3D nonvolatile memory device may include interlayer insulating layers and gate electrodes that are alternately stacked on top of one another, and channel layers passing through the interlayer insulating layers and the gate electrodes, with memory cells stacked along the channel layers. To improve the operational reliability of such a 3D nonvolatile memory device, various structures and manufacturing methods have been developed.

SUMMARY

An embodiment of the present disclosure may provide for a semiconductor memory device. The semiconductor memory device may include a stacked body, and first pass transistors and second pass transistors configured to couple global word lines to local lines, wherein any one of the plurality of conductive lines is a block select line, and gates of the first pass transistors and the second pass transistors are coupled to the block select line.

An embodiment of the present disclosure may provide for a semiconductor memory device. The semiconductor memory device may include a stacked body including a plurality of conductive lines, and including a stepped structure at a first end and a second end of the stacked body, first pass transistors and second pass transistors configured to couple global word lines to local lines, a plurality of first word line contacts and a first block select line contact that are respectively coupled at the first end to conductive lines of a first group, among the plurality of conductive lines, and that extend in a direction vertical to a substrate, and a plurality of second word line contacts and a second block select line contact that are respectively coupled at the second end to conductive lines of a second group, among the plurality of conductive lines, and that extend in the direction vertical to the substrate, wherein any one of the plurality of conductive lines is a block select line, and gates of the first pass transistors and the second pass transistors are coupled to the block select line.

An embodiment of the present disclosure may provide for a semiconductor memory device. The semiconductor memory device may include a memory block including a plurality of memory strings, each of the memory strings including a drain select transistor, a plurality of memory cells, a dummy cell, and a source select transistor, first pass transistors disposed on a first side of the memory block, and configured to couple global word lines to local lines coupled to gates of the plurality of memory cells, and second pass transistors disposed on a second side of the memory block and configured to couple the global word lines to the local word lines, wherein gates of the first pass transistors and the second pass transistors are coupled to one block select line.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a semiconductor memory device that is capable of minimizing the occurrence of differences in word line loading depending on the positions of memory cells.

Various embodiments of the present disclosure will now be described in detail with reference to the accompanying drawings so that those skilled in the art can practice the technical spirit of the present disclosure.

Figure 1:
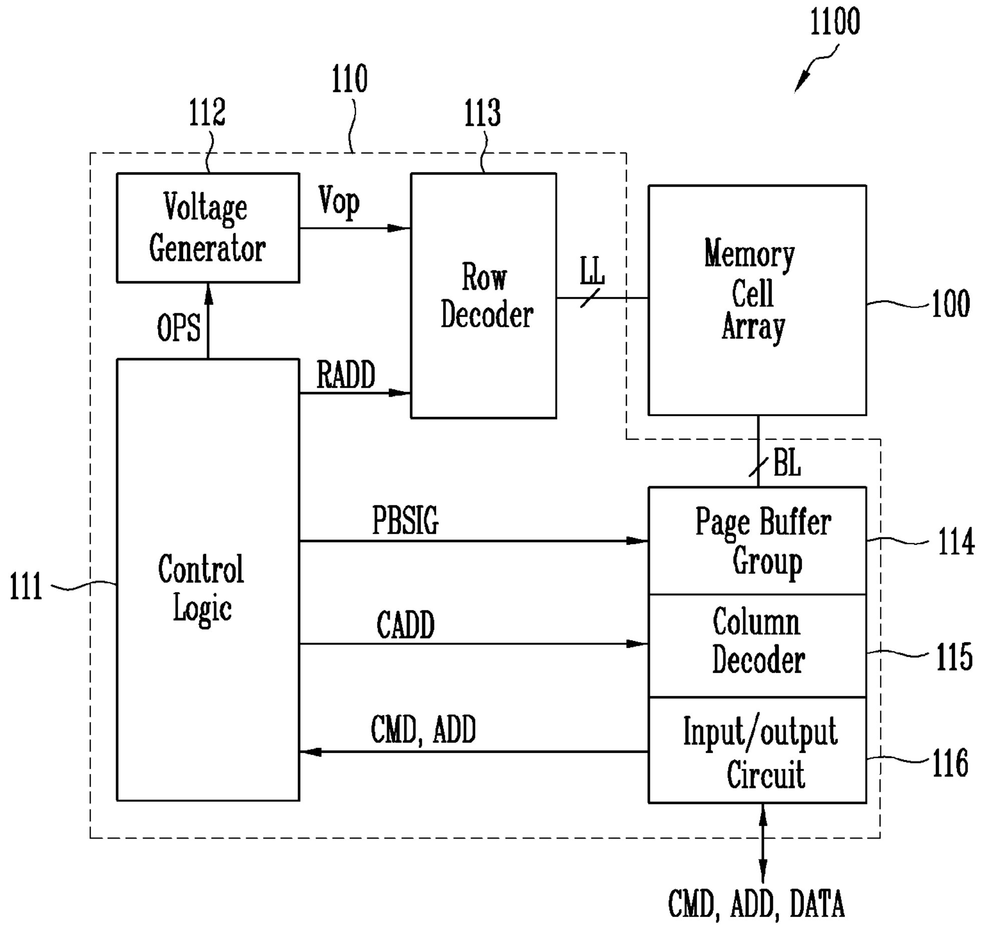
FIG. 1 is a diagram illustrating a semiconductor memory device according to an embodiment of the present disclosure.

FIG. 1 is a diagram illustrating a semiconductor memory device according to an embodiment of the present disclosure.

Referring to FIG. 1, a semiconductor memory device 1100 may include a memory cell array 100 in which data can be stored, and peripheral circuits 110 which is capable of performing a program operation, a read operation or an erase operation on the memory cell array 100.

The memory cell array 100 may include a plurality of memory blocks, each including nonvolatile memory cells. Local lines LL may be coupled to each of the memory blocks, and bit lines BL may be coupled in common to the memory blocks.

The peripheral circuits 110 may include control logic 111, a voltage generator 112, a row decoder 113, a page buffer group 114, a column decoder 115, and an input/output circuit 116. The control logic 111 may be implemented as hardware, software, or a combination of hardware and software. For example, the control logic 111 may be a control logic circuit operating in accordance with an algorithm and/or a processor executing control logic code.

The control logic 111 may control the voltage generator 112, the row decoder 113, the page buffer group 114, the column decoder 115, and the input/output circuit 116 in response to a command CMD and an address ADD. For example, the control logic 111 may output an operation signal OPS and a page buffer control signal PBSIG in response to the command CMD, and may output a row address RADD and a column address CADD in response to the address ADD.

The voltage generator 112 may generate and output operating voltages Vop required for a program operation, a read operation or an erase operation in response to the operation signal OPS. For example, the voltage generator 112 may generate and output the operating voltages Vop, such as a program voltage, a read voltage, an erase voltage, and a pass voltage.

The row decoder 113 may transfer the operating voltages Vop to a selected memory block through the local lines LL in response to the row address RADD. For example, the row decoder 113 may couple global lines and the local lines LL to which the operating voltages Vop are applied to each other, and then transfer the operating voltages Vop to the selected memory block.

The page buffer group 114 may include a plurality of page buffers coupled to the bit lines BL. The page buffer group 114 may temporarily store data in response to the page buffer control signal PBSIG during a program operation or a read operation.

The column decoder 115 may transfer data between the page buffer group 114 and the input/output circuit 116 in response to the column address CADD.

The input/output circuit 116 may receive a command CMD and an address ADDR from an external device, and may transmit the command CMD the address ADD to the control logic 111. The input/output circuit 116 may transmit data DATA, received from the external device, to the column decoder 115 during a program operation, and may output the data DATA, received from the column decoder 115, to the external device during a read operation.

Figure 2:
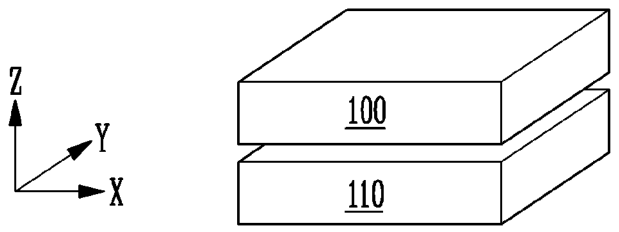
FIG. 2 is a diagram illustrating arrangement between a memory cell array and peripheral circuits.

FIG. 2 is a diagram illustrating arrangement between a memory cell array and peripheral circuits.

Referring to FIG. 2, the memory cell array 100 and the peripheral circuits 110 described above with reference to FIG. 1 may be arranged in various structures. For example, when a substrate is arranged horizontally to an X-Y direction, the memory cell array 100 may be disposed on the peripheral circuits 110 so that the memory cell array 100 and each of the peripheral circuits 110 are arranged in a direction (e.g., Z direction) vertical to the substrate. That is, the peripheral circuits 110 may be disposed between the substrate and the memory cell array 100.

Figure 3:
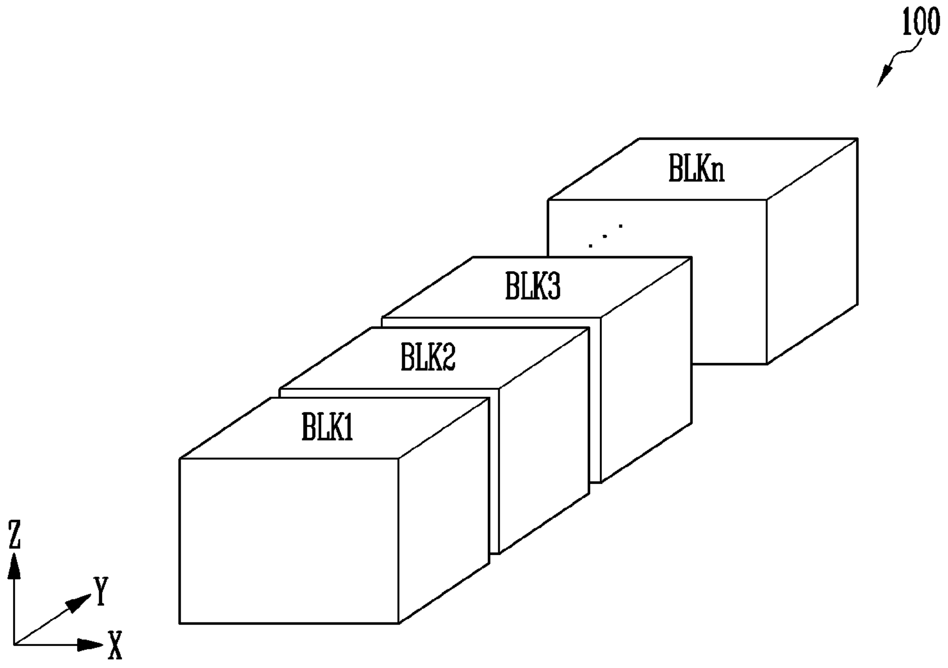
FIG. 3 is a diagram illustrating a memory cell array including memory blocks formed in a 3D structure.

FIG. 3 is a diagram illustrating a memory cell array including memory blocks formed in a 3D structure.

Referring to FIG. 3, when the memory cell array 100 includes memory blocks BLK1 to BLKn formed in a 3D structure, the memory blocks BLK1 to BLKn may be arranged in a Y direction. The Y direction may be a direction in which the bit lines BL of FIG. 1 extend.

Although FIG. 3 illustrates a configuration in which the memory cell array 100 includes one plane, the memory cell array 100 may include a plurality of planes. The plurality of planes may be arranged in an X direction, and memory blocks included in each plane may be arranged in the Y direction within the plane.

Figure 4:
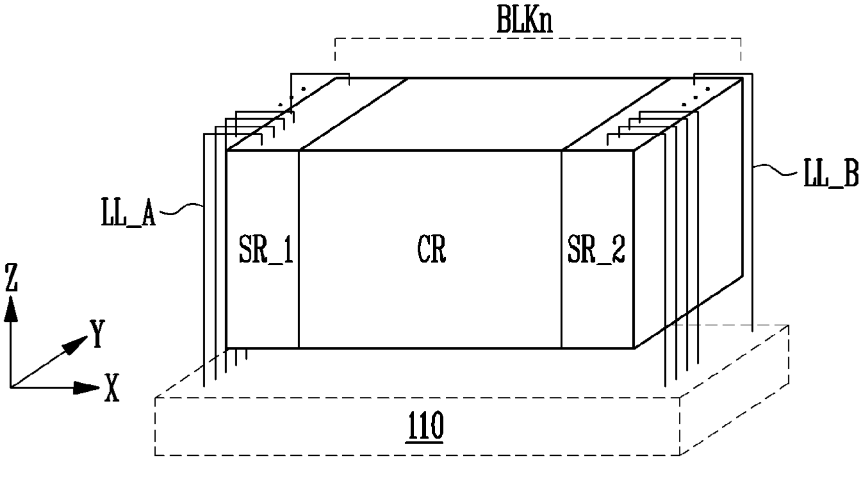
FIG. 4 is a diagram illustrating the configuration of a memory block and a connection relationship between the memory block and peripheral circuits.

FIG. 4 is a diagram illustrating the configuration of a memory block and a connection relationship between the memory block and peripheral circuits.

The memory blocks BLK1 to BLKn described in FIG. 3 may be configured in the same manner, and any one memory block BLKn among the memory blocks is illustrated in FIG. 4 by way of example.

Referring to FIG. 4, the memory block BLKn formed in a 3D structure may include a cell region CR including memory cells and slimming regions (SR_1 and SR_2) which electrically connect the peripheral circuits 110 to the cell region CR. For example, the first slimming region SR_1 may be arranged in a region adjacent to a first end of the cell region CR, and the second slimming region SR_2 may be arranged in a region adjacent to a second end of the cell region CR.

The cell region CR may include a plurality of memory strings in which memory cells, a dummy cell, and select transistors are stacked, and the first and second slimming regions SR_1 and SR_2 may include end portions of gate lines of memory cells, a gate line of the dummy cell, and gate lines of select transistors. For example, in the first and second slimming regions SR_1 and SR_2, gate lines may be stacked in a stepped structure, and may be formed in a stepped structure in which a gate line located in a lower portion extends longer than a gate line located in an upper portion. The gate lines exposed by the stepped structure may be coupled to the peripheral circuits 110 through contact plugs.

When the peripheral circuits 110 are disposed under the memory block BLKn (e.g., in a Z direction), first local lines LL_A for electrically connecting the first slimming region SR_1 to the peripheral circuits 110 may extend in the Z direction, and may be disposed to be spaced apart from each other in a Y direction. Further, second local lines LL_B for electrically connecting the second slimming region SR_2 to the peripheral circuits 110 may extend in the Z direction, and may be disposed to be spaced apart from each other in the Y direction.

The first local lines LL_A may be respectively coupled to first ends of the gate lines of the memory cells disposed in the cell region CR, and the second local lines LL_B may be respectively coupled to second ends of the gate lines of the memory cells.

In an embodiment, the first local lines LL_A may be respectively coupled to first ends of gate lines included in a first group, among the gate lines of the memory cells arranged in the cell region CR, and the second local lines LL_B may be respectively coupled to second ends of gate lines included in a second group, among the gate lines of the memory cells disposed in the cell region CR. The first group may be odd-numbered gate lines among the gate lines of all memory cells, and the second group may be even-numbered gate lines among the gate lines of all memory cells. The first group may indicate gate lines disposed in an upper portion among the gate lines of all the memory cells and the second group may indicate gate lines disposed under the gate lines in the first group.

Figure 5:
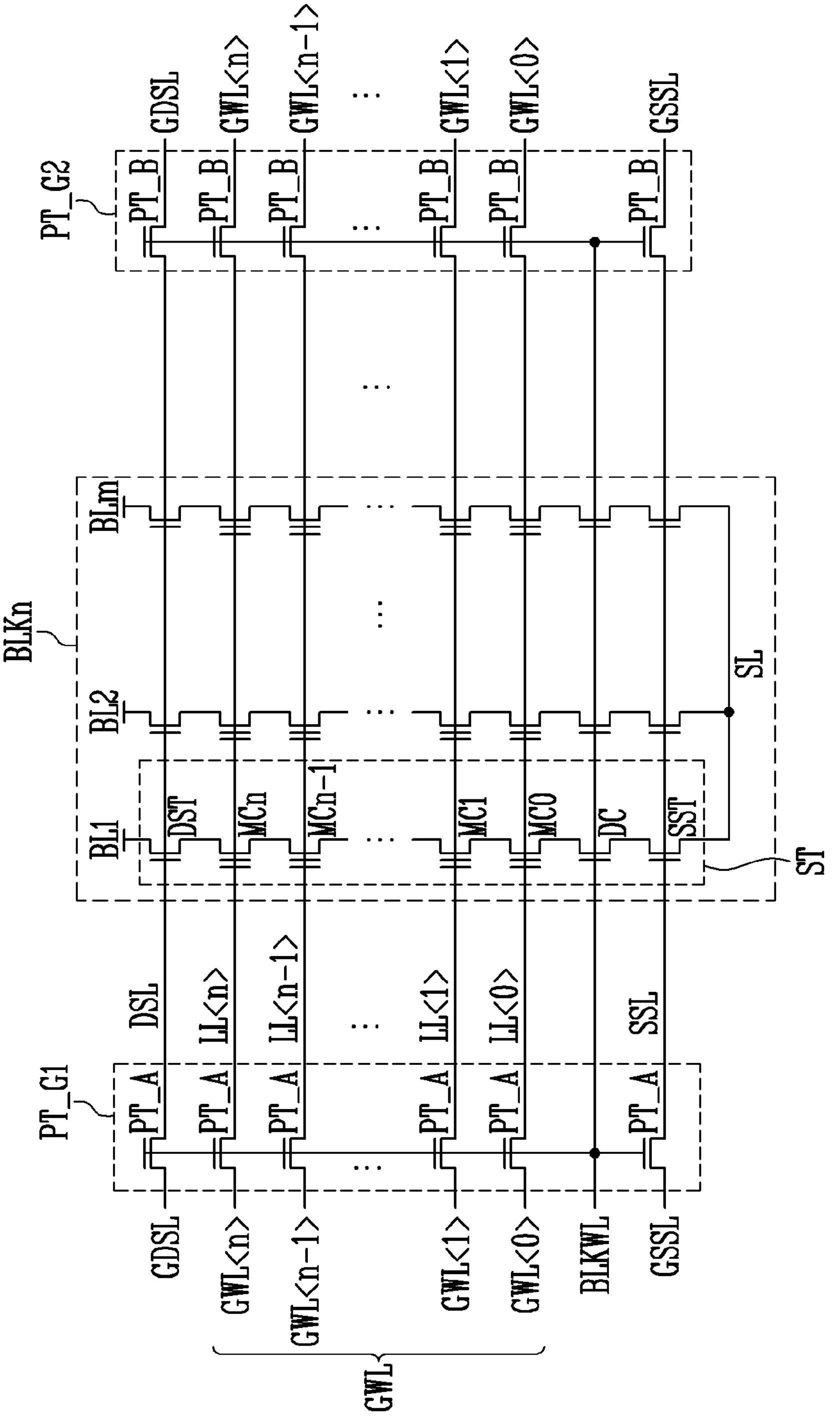
FIG. 5 is a circuit diagram illustrating a memory block and first and second pass transistor groups according to an embodiment of the present disclosure.

FIG. 5 is a circuit diagram illustrating a memory block and first and second pass transistor groups according to an embodiment of the present disclosure.

The plurality of memory blocks BLK1 to BLKn, described above with reference to FIG. 3, may have the same configuration, and any one memory block BLKn among the memory blocks will be illustrated in FIG. 5 by way of example.

The memory block BLKn may include a plurality of memory strings ST. Each of the plurality of memory strings ST may be coupled between any one of the plurality of bit lines BL1 to BLm and a source line SL. Each of the memory strings ST may include a drain select transistor DST, a plurality of memory cells MC0 to MCn, a dummy cell DC, and a source select transistor SST. A gate of the drain select transistor DST may be coupled to a drain select line DSL, gates of the plurality of memory cells MC0 to MCn may be coupled to a plurality of local lines LL<0> to LL<n>, a gate of the dummy cell DC may be coupled to a block select line BLKWL, and a gate of the source select transistor SST may be coupled to a source select line SSL.

A first pass transistor group PT_G1 and a second pass transistor group PT_G2 may be respectively arranged at both ends of the memory block BLKn. The first pass transistor group PT_G1 and the second pass transistor group PT_G2 may be circuit components included in the row decoder 113 of FIG. 1.

The first pass transistor group PT_G1 may include a plurality of first pass transistors PT_A. Respective gates of the plurality of first pass transistors PT_A may be coupled to the block select line BLKWL. The plurality of first pass transistors PT_A may couple or decouple a global drain select line GDSL to or from the drain select line DSL, couple or decouple a plurality of global word lines GWL<0> to GWL<n> to or from the local lines LL<0> to LL<n>, and couple or decouple a global source select line GSSL to or from the source select line SSL, in response to a signal applied through the block select line BLKWL.

The second pass transistor group PT_G2 may include a plurality of second pass transistors PT_B. Respective gates of the plurality of second pass transistors PT_B may be coupled to the block select line BLKWL. The plurality of second pass transistors PT_B may couple or decouple a global drain select line GDSL to or from the drain select line DSL, couple or decouple a plurality of global word lines GWL<0> to GWL<n> to or from the local lines LL<0> to LL<n>, and couple or decouple a global source select line GSSL to or from the source select line SSL, in response to a signal applied through the block select line BLKWL.

The above-described first pass transistor group PT_G1 and second pass transistor group PT_G2 may be arranged at both ends of the memory block BLKn, and may couple both ends of the plurality of local lines LL<0> to LL<n>, which are arranged in the memory block BLKn to extend in one direction, to the plurality of global word lines GWL<0> to GWL<n>.

The block select line BLKWL may be coupled to the first pass transistor group PT_G1 and the second pass transistor group PT_G2, and may be arranged to extend in one direction while overlapping the memory block BLKn. Furthermore, the block select line BLKWL may be coupled to gates of the dummy cells DC included in the memory block BLKn.

Figure 6:
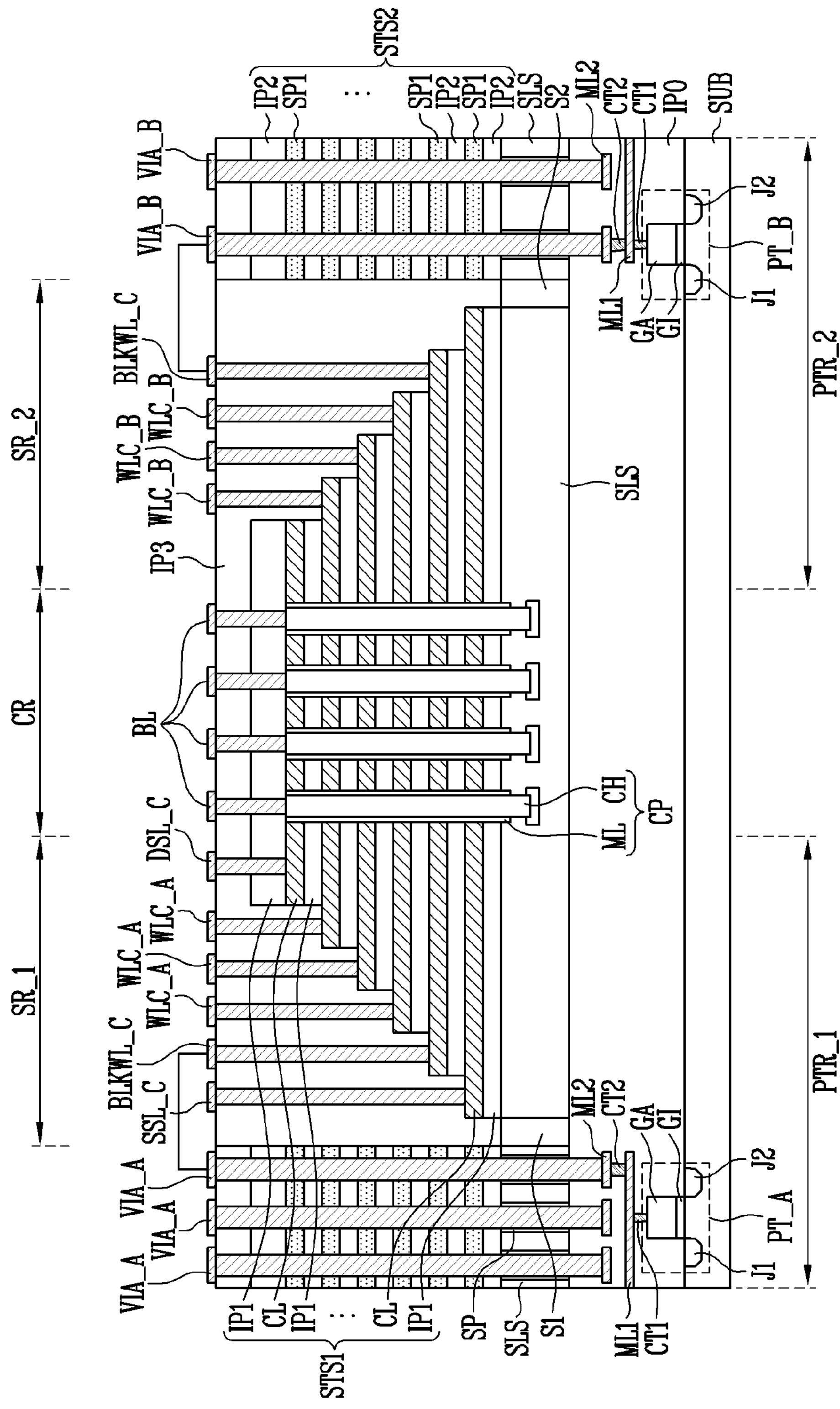
FIG. 6 is a sectional view of a semiconductor memory device for explaining a memory block and pass transistors according to an embodiment of the present disclosure.

FIG. 6 is a sectional view of a semiconductor memory device for explaining a memory block and pass transistors according to an embodiment of the present disclosure.

Referring to FIG. 6, the semiconductor memory device according to an embodiment of the present disclosure may include a substrate SUB. For example, the substrate SUB may be a bulk silicon substrate, a silicon-on-insulator substrate, a germanium substrate, a germanium-on-insulator substrate, a silicon-germanium substrate, or an epitaxial thin film substrate formed using a selective epitaxial growth method.

A first insulating layer IP0 may be provided on the substrate SUB. The first insulating layer IP0 may include an insulating material. For example, the first insulating layer IP0 may include oxide or nitride.

First pass transistors PT_A and second pass transistors PT_B may be provided on the substrate SUB. For example, the first pass transistors PT_A may be disposed in a first pass transistor region PTR_1 of the substrate SUB, and the second pass transistors PT_B may be disposed in a second pass transistor region PTR_2 of the substrate SUB.

The first pass transistors PT_A and the second pass transistors PT_B may be the first pass transistors PT_A and the second pass transistors PT_B of FIG. 5. The first pass transistors PT_A and the second pass transistors PT_B may be provided between the substrate SUB and the first insulating layer IP1. The first pass transistors PT_A and the second pass transistors PT_B may be covered with the first insulating layer IP1. Each of the first pass transistors PT_A and the second pass transistors PT_B may include a first impurity region J1, a second impurity region J2, a gate insulating layer G1, and a gate GA. The first impurity region J1 and the second impurity region J2 may be formed by doping the substrate SUB with impurities. The first impurity region J1 may be electrically connected to any one of the global word lines GWL<0> to GWL<n> of FIG. 5, and the second impurity region J2 may be electrically connected to any one of the local lines LL<0> to LL<n> of FIG. 5. The gate insulating layer G1 and the gate GA may be arranged to be sequentially stacked on the substrate SUB between the first impurity region J1 and the second impurity region J2. The first impurity region J1 and the second impurity region J2 may be portions of the substrate SUB.

A first line ML1 may be disposed on the first pass transistors PT_A, and may be a line corresponding to the block select line BLKWL of FIG. 5. The gate GA of the first pass transistors PT_A and the first line ML1 may be coupled to each other through a first contact CT1, and the first line ML1 may be coupled to second lines ML2 disposed over the first line ML1 through a second contact CT2. The first contact CT1, the first line ML1, the second contact CT2, and the second lines ML2 may be covered with the first insulating layer IP0.

A first line ML1 and second lines ML2 may be disposed on the second pass transistors PT_B, the gate GA of the second pass transistors PT_B and the first line ML1 may be coupled to each other through a first contact CT1, and the first line ML1 may be coupled to second lines ML2 disposed over the first line ML1 through a second contact CT2. The first contact CT1, the first line ML1, the second contact CT2, and the second lines ML2 may be covered with the first insulating layer IP0.

Each of the first contact CT1, the first line ML1, the second contact CT2, and the second lines ML2 may include a conductive material. In an example, each of the first contact CT1, the first line ML1, the second contact CT2, and the second lines ML2 may include copper, tungsten or aluminum.

Although not illustrated in the drawing, a transistor, a resistor, and a capacitor may be further provided in the first insulating layer IP0. The transistor, the resistor, and the capacitor may be used as elements of a peripheral circuit including a row decoder, a column decoder, a page buffer circuit, and an input/output circuit.

A source structure SLS may be provided on the first insulating layer IP0. The source structure SLS may be used as the source line SL of FIG. 5. The source structure SLS may include a conductive material. In an example, the source structure SLS may include doped polysilicon. The source structure SLS may be a single-layer structure or a multi-layer structure.

A first stacked body STS1 and a second stacked body STS2 may be provided on the source structure SLS. In an embodiment, a stacked body may include both the first stacked body STS1 and the second stacked body STS2.

The first stacked body STS1 may be disposed in a cell region CR and first and second slimming regions SR_1 and SR_2. The first stacked body STS1 may include first insulating patterns IP1 and conductive lines CL that are alternately stacked.

The first insulating patterns IP1 may include an insulating material. For example, the first insulating patterns IP1 may include oxide. The conductive lines CL may include a conductive material. For example, the conductive lines CL may include at least one of a doped silicon layer, a metal silicide layer, tungsten, nickel, and cobalt. The conductive lines CL may be used as word lines coupled to memory cells, drain and source select lines coupled to a drain select transistor and a source select transistor, and a block select line. For example, at least one conductive line CL disposed in a lowermost portion may be the source select line, at least one conductive line CL disposed in an uppermost portion may be the drain select line, a plurality of conductive lines CL disposed between the source select line and the drain select line may be the word lines, and one conductive line CL disposed between the source select line and the word lines may be the block select line BLKWL of FIG. 5. In an embodiment of the present disclosure, although the block select line is described as being a conductive line adjacent to the source select line, the present disclosure is not limited thereto, and at least one conductive line among the plurality of conductive lines CL may be used as the block select line.

The first stacked body STS1 may have a stepped structure. For example, in the first and second slimming regions SR_1 and SR_2, the first insulating patterns IP1 and the conductive lines CL of the first stacked body STS1 are formed in a stepped shape, and thus the stepped structure may be formed. As the stepped structure is formed, portions of upper surfaces of respective conductive lines CL in the first stacked body STS1 may be exposed. In an embodiment, in the first and second slimming regions SR_1 and SR_2, the first insulating patterns IP1 and the conductive lines CL of the first stacked body STS1 are formed in a stepped shape, and thus the stepped structure may be formed, as shown in FIG. 6.

Cell plugs CP penetrating the first stacked body STS1 may be provided. For example, the cell plugs CP may penetrate the first insulating patterns IP1 and the conductive lines CL of the first stacked body STS1 in the cell region CR. The cell plugs CP may extend in a direction vertical to the substrate SUB in the first stacked body STS1 of the cell region CR, and may extend into the source structure SLS under the first stacked body STS1.

Each of the cell plugs CP may include a channel layer CH penetrating the first stacked body STS1 and a memory layer ML enclosing the channel layer CH. The channel layer CH may include a semiconductor material. For example, the channel layer CH may include polysilicon.

The memory layer ML may include multiple insulating layers. The memory layer ML may include a tunnel layer enclosing the channel layer CH, a storage layer enclosing the tunnel layer, and a blocking layer enclosing the storage layer. The tunnel layer may include an insulating material that enables charge tunneling. For example, the tunnel layer may include oxide. In an embodiment, the storage layer may include a material capable of trapping charges. For example, the storage layer may include at least one of nitride, silicon, a phase-change material, and nanodots. In an embodiment, the blocking layer may include an insulating material capable of blocking the movement of charges. For example, the blocking layer may include oxide. In an embodiment, the thickness of the tunnel layer may be less than that of the blocking layer.

Apart from the configuration illustrated in the drawing, each of the cell plugs CP may further include a filling layer in the channel layer CH. The filling layer may include an insulating material. For example, the filling layer may include oxide.

The memory layer ML may be formed to expose a partial lower portion of the channel layer CH, and the exposed partial lower portion of the channel layer CH may be electrically connected to the source structure SLS while contacting the source structure SLS.

In each of the cell plugs CP, portions enclosed by the conductive lines CL used as word lines are defined as the memory cells (e.g., MC0 to MCn of FIG. 5), and a portion enclosed by the conductive line CL used as the block select line may be defined as a dummy cell (e.g., DC of FIG. 5).

Bit lines BL coupled to the cell plugs CP may be provided. The bit lines BL may be coupled to the channel layers CH of the cell plugs CP. Each of the bit lines BL may include a conductive material. For example, each bit line BL may include copper, aluminum, or tungsten.

A source select line contact SSL_C, a block select line contact BLKWL_C, first word line contacts WLC_A, a drain select line contact DSL_C, and second word line contacts WLC_B, which are coupled to the conductive lines CL of the first stacked body STS1, may be provided.

The source select line contact SSL_C, the block select line contact BLKWL_C, the first word line contacts WLC_A, the drain select line contact DSL_C, and the second word line contacts WLC_B may be coupled to portions of the upper surfaces of the conductive lines CL defining the stepped structure.

In the first slimming region SR_1, the source select line contact SSL_C, the block select line contact BLKWL_C, the first word line contacts WLC_A, and the drain select line contact DSL_C may be disposed, and in the second slimming region SR_2, the block select line contact BLKWL_C and the second word line contacts WLC_B may be disposed. In an embodiment, the block select line contact BLKWL_C in the first slimming region SR_1 may be referred to as a first block select line contact and the block select line contact BLKWL_C in the second slimming region SR_2 may be referred to as a second block select line contact.

Both ends of the conductive lines CL used as word lines may be coupled to the first word line contacts WLC_A and the second word line contacts WLC_B, respectively. Further, both ends of the conductive line CL used as the block select line may be coupled to the block select line contacts BLKWL_C.

Second stacked bodies STS2 may be provided on both sides of the first stacked body STS1. The second stacked bodies STS2 may be arranged to partially overlap the first pass transistor region PTR_1 and the second pass transistor region PTR_2. Each of the second stacked bodies STS2 may include second insulating patterns IP2 and sacrificial patterns SP1 that are alternately stacked.

The second insulating patterns IP2 may include an insulating material. For example, the second insulating patterns IP2 may include oxide. The sacrificial patterns SP1 may include an insulating material. For example, the sacrificial patterns SP1 may include nitride.

A second insulating layer IP3 covering the first stacked body STS1 and the second stacked bodies STS2 may be provided. The second insulating layer IP3 may include an insulating material. For example, the second insulating layer IP3 may include oxide.

A plurality of first vias VIA_A and a plurality of second vias VIA_B extending in a direction vertical to the substrate SUB may be provided in the second stacked bodies STS2. The plurality of first vias VIA_A may vertically pass through the second stacked body STS2 and the source structure SLS that are formed in the first pass transistor region PTR_1 and then extend into the first insulating layer IP0. The plurality of first vias VIA_A may be coupled to the second lines ML2 in the first insulating layer IP0. The plurality of first vias VIA_A may correspond to the source select line contact SSL_C, the block select line contact BLKWL_C, the first word line contacts WLC_A, and the drain select line contact DSL_C, respectively, which are formed in the first slimming region SR_1 overlapping the first pass transistor region PTR_1, and may be coupled thereto. Furthermore, the block select line contact BLKWL_C may be electrically connected to the first line ML1 corresponding to the block select line BLKWL of FIG. 5 through the first vias VIA_A, the second line ML2, and the second contact CT2 corresponding thereto. Furthermore, the first vias VIA_A corresponding to the first word line contacts WLC_A may be coupled to the second impurity region J2 of the first pass transistors PT_A through the second line ML2.

The plurality of second vias VIA_B may vertically pass through the second stacked body STS2 and the source structure SLS that are formed in the second pass transistor region PTR_2 and then extend into the first insulating layer IP0. The plurality of second vias VIA_B may be coupled to the second lines ML2 in the first insulating layer IP0. Furthermore, the block select line contact BLKWL_C may be electrically connected to the first line ML1 corresponding to the block select line BLKWL of FIG. 5 through the second via VIA_B, the second line ML2, and the second contact CT2 corresponding thereto. Furthermore, the second vias VIA_B corresponding to the second word line contacts WLC_B may be coupled to the second impurity region J2 of the second pass transistors PT_B through the second line ML2.

Spacer layers SP may be formed on the sidewalls of the plurality of first vias VIA_A and the plurality of second vias VIA_B, and may electrically and physically isolate the plurality of first vias VIA_A and the plurality of second vias VIA_B from the source structure SLS.

First and second separation structures S1 and S2 may be disposed between the source structure SLS under the first stacked body STS1 and the source structures SLS under the second stacked bodies STS2.

Figure 7:
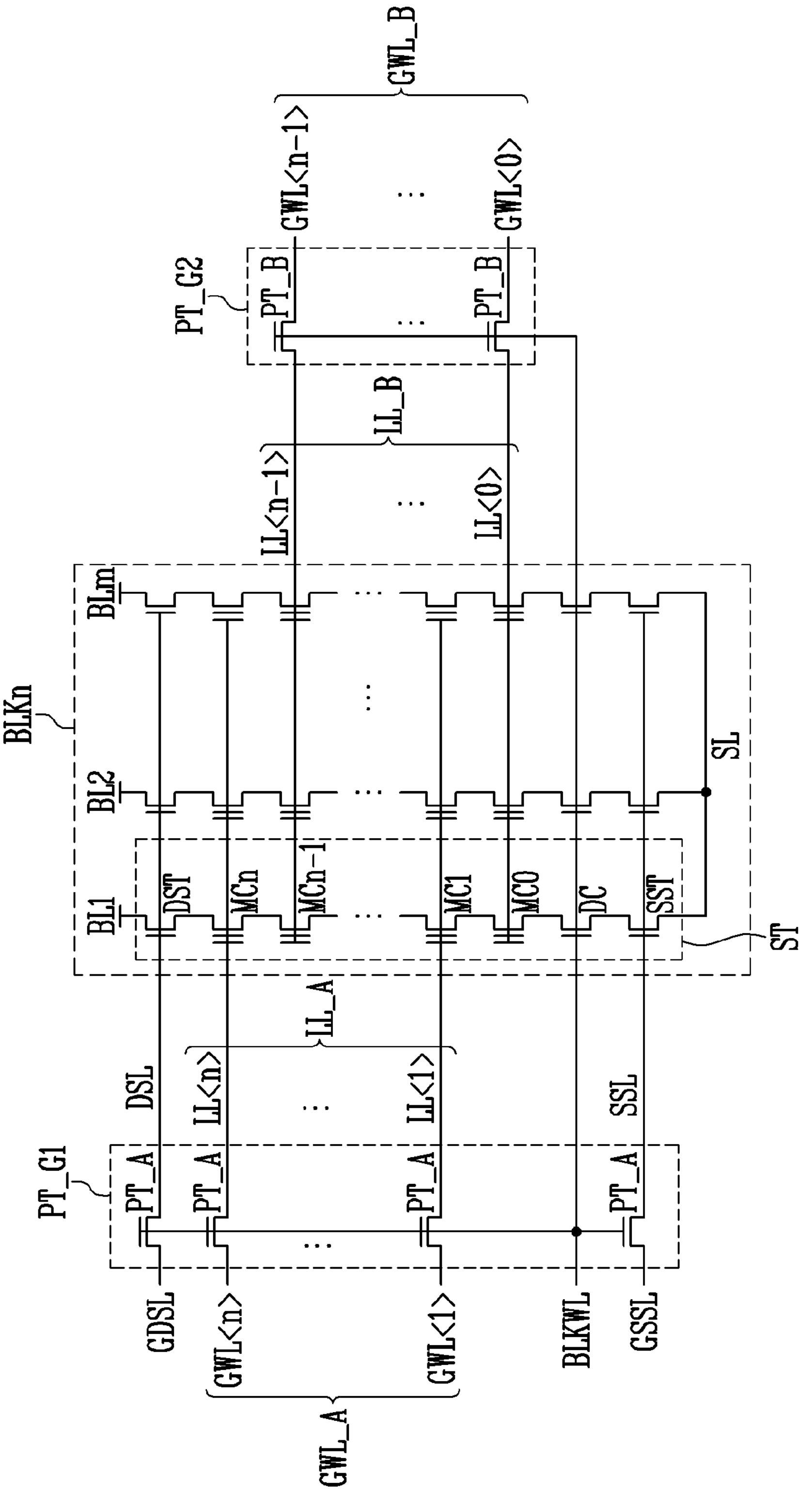
FIG. 7 is a circuit diagram illustrating a memory block and first and second pass transistor groups according to an embodiment of the present disclosure.

FIG. 7 is a circuit diagram illustrating a memory block and first and second pass transistor groups according to an embodiment of the present disclosure.

The memory blocks BLK1 to BLKn described in FIG. 3 may be configured in the same manner, and any one memory block BLKn among the memory blocks is illustrated in FIG. 7 by way of example.

The memory block BLKn may include a plurality of memory strings ST. Each of the plurality of memory strings ST may be coupled between any one of the plurality of bit lines BL1 to BLm and a source line SL. Each of the memory strings ST may include a drain select transistor DST, a plurality of memory cells MC0 to MCn, a dummy cell DC, and a source select transistor SST. A gate of the drain select transistor DST may be coupled to a drain select line DSL, gates of the plurality of memory cells MC0 to MCn may be coupled to a plurality of local lines LL<0> to LL<n>, a gate of the dummy cell DC may be coupled to a block select line BLKWL, and a gate of the source select transistor SST may be coupled to a source select line SSL.

A first pass transistor group PT_G1 and a second pass transistor group PT_G2 may be respectively arranged at both ends of the memory block BLKn. The first pass transistor group PT_G1 and the second pass transistor group PT_G2 may be circuit components included in the row decoder 113 of FIG. 1.

The first pass transistor group PT_G1 may include a plurality of first pass transistors PT_A. Respective gates of the plurality of first pass transistors PT_A may be coupled to the block select line BLKWL. The plurality of first pass transistors PT_A may couple or decouple a global drain select line GDSL to or from the drain select line DSL, couple or decouple global word lines of a first group GWL_A among a plurality of global word lines GWL<0> to GWL<n> to or from local lines of a first group LL_A among the plurality of local lines LL<0> to LL<n>, and couple or decouple a global source select line GSSL to or from the source select line SSL in response to a signal applied through the block select line BLKWL. The global word lines of the first group GWL_A may be odd-numbered global word lines, and the local lines of the first group LL_A may be odd-numbered local lines.

The second pass transistor group PT_G2 may include a plurality of second pass transistors PT_B. Respective gates of the plurality of second pass transistors PT_B may be coupled to the block select line BLKWL. The plurality of second pass transistors PT_B may couple or decouple global word lines of a second group GWL_B among the plurality of global word lines GWL<0> to GWL<n> to or from local lines of a second group LL_B among the plurality of local lines LL<0> to LL<n> in response to a signal applied through the block select line BLKWL. The global word lines of the second group GWL_B may be even-numbered global word lines, and the local lines of the second group LL_B may be even-numbered local lines.

The block select line BLKWL may be coupled to the first pass transistor group PT_G1 and the second pass transistor group PT_G2, and may be arranged to extend in one direction while overlapping the memory block BLKn. Furthermore, the block select line BLKWL may be coupled to gates of the dummy cells DC included in the memory block BLKn.

Figure 8:
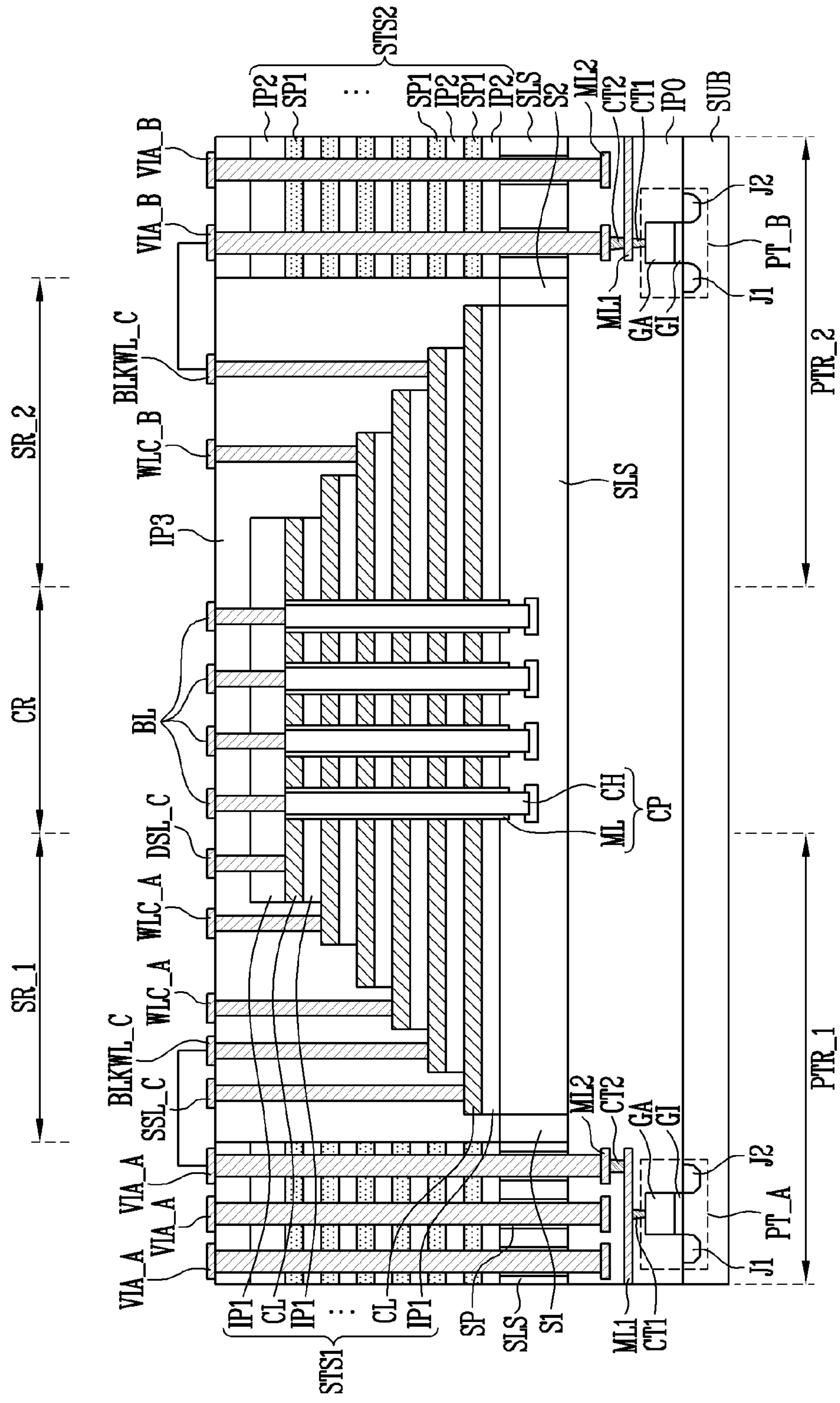
FIG. 8 is a sectional view of a semiconductor memory device for explaining a memory block and pass transistors according to an embodiment of the present disclosure.

FIG. 8 is a sectional view of a semiconductor memory device for explaining a memory block and pass transistors according to an embodiment of the present disclosure.

Referring to FIG. 8, the semiconductor memory device according to an embodiment of the present disclosure may include a substrate SUB. For example, the substrate SUB may be a bulk silicon substrate, a silicon-on-insulator substrate, a germanium substrate, a germanium-on-insulator substrate, a silicon-germanium substrate, or an epitaxial thin film substrate formed using a selective epitaxial growth method.

A first insulating layer IP0 may be provided on the substrate SUB. The first insulating layer IP0 may include an insulating material. For example, the first insulating layer IP0 may include oxide or nitride.

First pass transistors PT_A and second pass transistors PT_B may be provided on the substrate SUB. For example, the first pass transistors PT_A may be disposed in a first pass transistor region PTR_1 of the substrate SUB, and the second pass transistors PT_B may be disposed in a second pass transistor region PTR_2 of the substrate SUB.

The first pass transistors PT_A and the second pass transistors PT_B may be the first pass transistors PT_A and the second pass transistors PT_B of FIG. 5. The first pass transistors PT_A and the second pass transistors PT_B may be provided between the substrate SUB and the first insulating layer IP0. The first pass transistors PT_A and the second pass transistors PT_B may be covered with the first insulating layer IP0. Each of the first pass transistors PT_A and the second pass transistors PT_B may include a first impurity region J1, a second impurity region J2, a gate insulating layer GI, and a gate GA. The first impurity region J1 and the second impurity region J2 may be formed by doping the substrate SUB with impurities. The first impurity region J1 may be electrically connected to any one of the global word lines GWL<0> to GWL<n> of FIG. 5, and the second impurity region J2 may be electrically connected to any one of the local lines LL<0> to LL<n> of FIG. 5. The gate insulating layer GI and the gate GA may be arranged to be sequentially stacked on the substrate SUB between the first impurity region J1 and the second impurity region J2. The first impurity region J1 and the second impurity region J2 may be portions of the substrate SUB.

A first line ML1 may be disposed on the first pass transistors PT_A, and may be a line corresponding to the block select line BLKWL of FIG. 5. The gate GA of the first pass transistors PT_A and the first line ML1 may be coupled to each other through a first contact CT1, and the first line ML1 may be coupled to a second line ML2 disposed over the first line ML1 through a second contact CT2. The first contact CT1, the first line ML1, the second contact CT2, and the second line ML2 may be covered with the first insulating layer IP0.

A first line ML1 and a second line ML2 may be disposed on the second pass transistors PT_B, the gate GA of the second pass transistors PT_B and the first line ML1 may be coupled to each other through a first contact CT1, and the first line ML1 may be coupled to a second line ML2 disposed over the first line ML1 through a second contact CT2. The first contact CT1, the first line ML1, the second contact CT2, and the second line ML2 may be covered with the first insulating layer IP0.

Each of the first contact CT1, the first line ML1, the second contact CT2, and the second line ML2 may include a conductive material. In an example, each of the first contact CT1, the first line ML1, the second contact CT2, and the second line ML2 may include copper, tungsten or aluminum.

Although not illustrated in the drawing, a transistor, a resistor, and a capacitor may be further provided in the first insulating layer IP0. In an embodiment, the transistor, the resistor, and the capacitor may be used as elements of a peripheral circuit including a row decoder, a column decoder, a page buffer circuit, and an input/output circuit.

A source structure SLS may be provided on the first insulating layer IP0. The source structure SLS may be used as the source line SL of FIG. 5. The source structure SLS may include a conductive material. In an example, the source structure SLS may include doped polysilicon. The source structure SLS may be a single-layer structure or a multi-layer structure.

A first stacked body STS1 and a second stacked body STS2 may be provided on the source structure SLS.

The first stacked body STS1 may be disposed in a cell region CR and first and second slimming regions SR_1 and SR_2. The first stacked body STS1 may include first insulating patterns IP1 and conductive lines CL that are alternately stacked.

The first insulating patterns IP1 may include an insulating material. For example, the first insulating patterns IP1 may include oxide. The conductive lines CL may include a conductive material. For example, the conductive lines CL may include at least one of a doped silicon layer, a metal silicide layer, tungsten, nickel, and cobalt. The conductive lines CL may be used as word lines coupled to memory cells, drain and source select lines coupled to a drain select transistor and a source select transistor, and a block select line. For example, at least one conductive line CL disposed in a lowermost portion may be the source select line, at least one conductive line CL disposed in an uppermost portion may be the drain select line, a plurality of conductive lines CL disposed between the source select line and the drain select line may be the word lines, and one conductive line CL disposed between the source select line and the word lines may be the block select line BLKWL of FIG. 5. In an embodiment of the present disclosure, although the block select line is described as being a conductive line adjacent to the source select line, the present disclosure is not limited thereto, and at least one conductive line among the plurality of conductive lines CL may be used as the block select line.

The first stacked body STS1 may have a stepped structure. For example, in the first and second slimming regions SR_1 and SR_2, the first insulating patterns IP1 and the conductive lines CL of the first stacked body STS1 are formed in a stepped shape, and thus the stepped structure may be formed. As the stepped structure is formed, portions of upper surfaces of respective conductive lines CL in the first stacked body STS1 may be exposed.

Cell plugs CP penetrating the first stacked body STS1 may be provided. For example, the cell plugs CP may penetrate the first insulating patterns IP1 and the conductive lines CL of the first stacked body STS1 in the cell region CR. The cell plugs CP may extend in a direction vertical to the substrate SUB in the first stacked body STS1 of the cell region CR, and may extend into the source structure SLS under the first stacked body STS1.

Each of the cell plugs CP may include a channel layer CH penetrating the first stacked body STS1 and a memory layer ML enclosing the channel layer CH. The channel layer CH may include a semiconductor material. For example, the channel layer CH may include polysilicon.

The memory layer ML may include multiple insulating layers. The memory layer ML may include a tunnel layer enclosing the channel layer CH, a storage layer enclosing the tunnel layer, and a blocking layer enclosing the storage layer. The tunnel layer may include an insulating material that enables charge tunneling. For example, the tunnel layer may include oxide. In an embodiment, the storage layer may include a material capable of trapping charges. For example, the storage layer may include at least one of nitride, silicon, a phase-change material, and nanodots. In an embodiment, the blocking layer may include an insulating material capable of blocking the movement of charges. For example, the blocking layer may include oxide. In an embodiment, the thickness of the tunnel layer may be less than that of the blocking layer.

Apart from the configuration illustrated in the drawing, each of the cell plugs CP may further include a filling layer in the channel layer CH. The filling layer may include an insulating material. For example, the filling layer may include oxide.

The memory layer ML may be formed to expose a partial lower portion of the channel layer CH, and the exposed partial lower portion of the channel layer CH may be electrically connected to the source structure SLS while contacting the source structure SLS.

In each of the cell plugs CP, portions enclosed by the conductive lines CL used as word lines are defined as the memory cells (e.g., MC0 to MCn of FIG. 5), and a portion enclosed by the conductive line CL used as the block select line may be defined as a dummy cell (e.g., DC of FIG. 5).

Bit lines BL coupled to the cell plugs CP may be provided. The bit lines BL may be coupled to the channel layers CH of the cell plugs CP. Each of the bit lines BL may include a conductive material. For example, each bit line BL may include copper, aluminum, or tungsten.

A source select line contact SSL_C, a block select line contact BLKWL_C, first word line contacts WLC_A, a drain select line contact DSL_C, and second word line contacts WLC_B, which are coupled to the conductive lines CL of the first stacked body STS1, may be provided.

The source select line contact SSL_C, the block select line contact BLKWL_C, the first word line contacts WLC_A, the drain select line contact DSL_C, and the second word line contacts WLC_B may be coupled to portions of the upper surfaces of the conductive lines CL defining the stepped structure.

In the first slimming region SR_1, the source select line contact SSL_C, the block select line contact BLKWL_C, the first word line contacts WLC_A, and the drain select line contact DSL_C may be disposed, and in the second slimming region SR_2, the block select line contact BLKWL_C and the second word line contacts WLC_B may be disposed.

The first word line contacts WLC_A formed in the first slimming region SR_1 may be coupled to odd-numbered conductive lines CL, respectively, among the plurality of conductive lines CL used as word lines. The second word line contacts WLC_B formed in the second slimming region SR_2 may be coupled to even-numbered conductive lines CL, respectively, among the plurality of conductive lines CL used as word lines.

In other words, the first word line contacts WLC_A and the second word line contacts WLC_B coupled to the conductive lines CL used as word lines may be distributed and disposed in the first slimming region SR_1 and the second slimming region SR_2.

Further, both ends of the conductive line CL used as the block select line may be coupled to the block select line contacts BLKWL_C.

Second stacked bodies STS2 may be provided on both sides of the first stacked body STS1. The second stacked bodies STS2 may be arranged to partially overlap the first pass transistor region PTR_1 and the second pass transistor region PTR_2. Each of the second stacked bodies STS2 may include second insulating patterns IP2 and sacrificial patterns SP1 that are alternately stacked.

The second insulating patterns IP2 may include an insulating material. For example, the second insulating patterns IP2 may include oxide. The sacrificial patterns SP1 may include an insulating material. For example, the sacrificial patterns SP1 may include nitride.

A second insulating layer IP3 covering the first stacked body STS1 and the second stacked bodies STS2 may be provided. The second insulating layer IP3 may include an insulating material. For example, the second insulating layer IP3 may include oxide.

A plurality of first vias VIA_A and a plurality of second vias VIA_B extending in a direction vertical to the substrate SUB may be provided in the second stacked bodies STS2. The plurality of first vias VIA_A may vertically pass through the second stacked body STS2 and the source structure SLS that are formed in the first pass transistor region PTR_1 and then extend into the first insulating layer IP0. The plurality of first vias VIA_A may be coupled to the second lines ML2 in the first insulating layer IP0. The plurality of first vias VIA_A may correspond to the source select line contact SSL_C, the block select line contact BLKWL_C, the first word line contacts WLC_A, and the drain select line contact DSL_C, respectively, which are formed in the first slimming region SR_1 overlapping the first pass transistor region PTR_1, and may be coupled thereto. Furthermore, the first vias VIA_A corresponding to the first word line contacts WLC_A may be coupled to the second impurity region J2 of the first pass transistors PT_A through the second line ML2.

The plurality of second vias VIA_B may vertically pass through the second stacked body STS2 and the source structure SLS that are formed in the second pass transistor region PTR_2 and then extend into the first insulating layer IP0. The plurality of second vias VIA_B may be coupled to the second lines ML2 in the first insulating layer IP0. Furthermore, the block select line contact BLKWL_C may be electrically connected to the first line ML1 corresponding to the block select line BLKWL of FIG. 5 through the second via VIA_B, the second line ML2, and the second contact CT2 corresponding thereto. Furthermore, the second vias VIA_B corresponding to the second word line contacts WLC_B may be coupled to the second impurity region J2 of the second pass transistors PT_B through the second line ML2.

First and second separation structures S1 and S2 may be disposed between the source structure SLS under the first stacked body STS1 and the source structures SLS under the second stacked bodies STS2.

Figure 9:
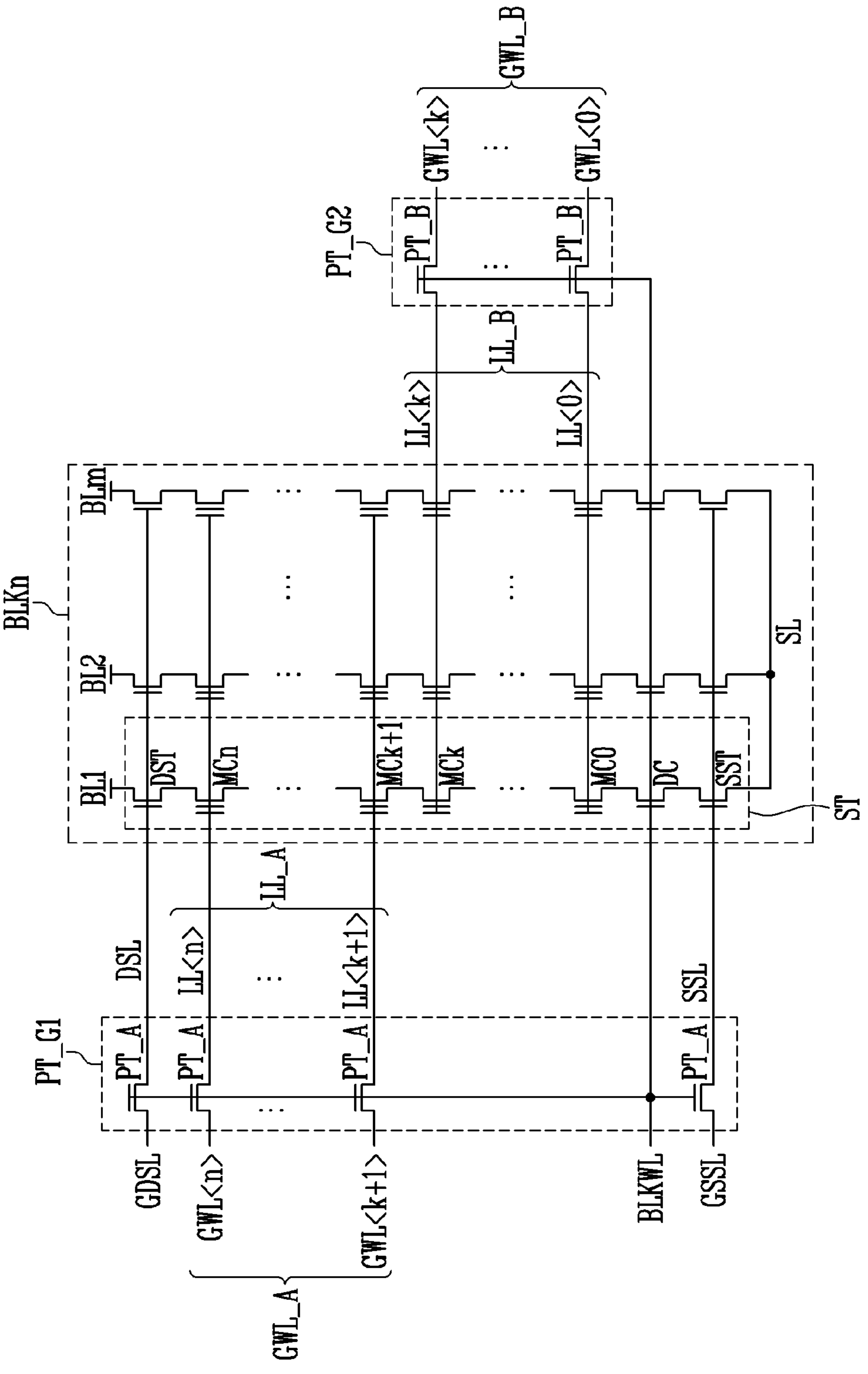
FIG. 9 is a circuit diagram illustrating a memory block and first and second pass transistor groups according to an embodiment of the present disclosure.

FIG. 9 is a circuit diagram illustrating a memory block and first and second pass transistor groups according to an embodiment of the present disclosure.

The memory blocks BLK1 to BLKn described in FIG. 3 may be configured in the same manner, and any one memory block BLKn among the memory blocks is illustrated in FIG. 9 by way of example.

The memory block BLKn may include a plurality of memory strings ST. Each of the plurality of memory strings ST may be coupled between any one of the plurality of bit lines BL1 to BLm and a source line SL. Each of the memory strings ST may include a drain select transistor DST, a plurality of memory cells MC0 to MCn, a dummy cell DC, and a source select transistor SST. A gate of the drain select transistor DST may be coupled to a drain select line DSL, gates of the plurality of memory cells MC0 to MCn may be coupled to a plurality of local lines LL<0> to LL<n>, a gate of the dummy cell DC may be coupled to a block select line BLKWL, and a gate of the source select transistor SST may be coupled to a source select line SSL.

A first pass transistor group PT_G1 and a second pass transistor group PT_G2 may be respectively arranged at both ends of the memory block BLKn. The first pass transistor group PT_G1 and the second pass transistor group PT_G2 may be circuit components included in the row decoder 113 of FIG. 1.

The first pass transistor group PT_G1 may include a plurality of first pass transistors PT_A. Respective gates of the plurality of first pass transistors PT_A may be coupled to the block select line BLKWL. The plurality of first pass transistors PT_A may couple or decouple a global drain select line GDSL to or from the drain select line DSL, couple or decouple global word lines of a first group GWL_A among a plurality of global word lines GWL<0> to GWL<n> to or from local lines of a first group LL_A among the plurality of local lines LL<0> to LL<n>, and couple or decouple a global source select line GSSL to or from the source select line SSL in response to a signal applied through the block select line BLKWL. The local lines of the first group LL_A may be local lines LL<k+1> to LL<n> adjacent to the drain select line DSL, and the global word lines of the first group GWL_A may be global word lines GWL<k+1> to GWL<n> corresponding to the local lines LL<k+1> to LL<n>, respectively.

The second pass transistor group PT_G2 may include a plurality of second pass transistors PT_B. Respective gates of the plurality of second pass transistors PT_B may be coupled to the block select line BLKWL. The plurality of second pass transistors PT_B may couple or decouple global word lines of a second group GWL_B among the plurality of global word lines GWL<0> to GWL<n> to or from local lines of a second group LL_B among the plurality of local lines LL<0> to LL<n> in response to a signal applied through the block select line BLKWL. The local lines of the second group LL_B may be local lines LL<0> to LL<k> adjacent to the source select line SSL, and the global word lines of the second group GWL_B may be global word lines GWL<0> to GWL<k> corresponding to the local lines LL<0> to LL<k>, respectively.

The block select line BLKWL may be coupled to the first pass transistor group PT_G1 and the second pass transistor group PT_G2, and may be arranged to extend in one direction while overlapping the memory block BLKn. Furthermore, the block select line BLKWL may be coupled to gates of the dummy cells DC included in the memory block BLKn.

Figure 10:
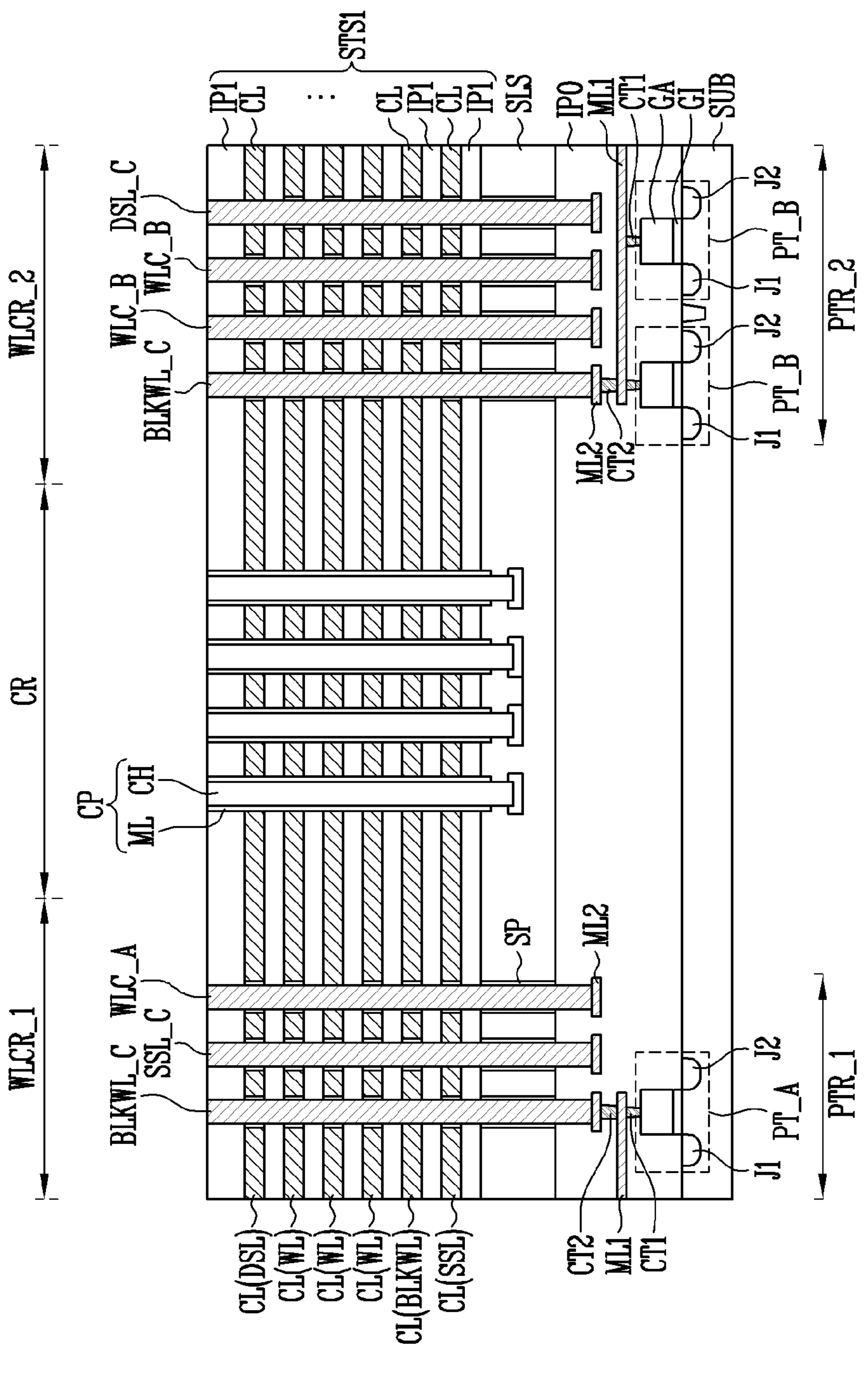
FIG. 10 is a sectional view of a semiconductor memory device for explaining a memory block and pass transistors according to an embodiment of the present disclosure.

FIG. 10 is a sectional view of a semiconductor memory device for explaining a memory block and pass transistors according to an embodiment of the present disclosure.

Although, in the foregoing FIGS. 6 and 8, an example in which first and second slimming regions SR_1 and SR_2 are disposed on the sides of the cell region CR has been described, the conductive lines CL disposed in the cell region CR may extend to first and second word line contact regions WLCR_1 and WLCR2 disposed at both ends of the cell region CR without forming a stepped structure.

Referring to FIG. 10, the semiconductor memory device according to an embodiment of the present disclosure may include a substrate SUB. For example, the substrate SUB may be a bulk silicon substrate, a silicon-on-insulator substrate, a germanium substrate, a germanium-on-insulator substrate, a silicon-germanium substrate, or an epitaxial thin film substrate formed using a selective epitaxial growth method.

A first insulating layer IP0 may be provided on the substrate SUB. The first insulating layer IP0 may include an insulating material. For example, the first insulating layer IP0 may include oxide or nitride.

First pass transistors PT_A and second pass transistors PT_B may be provided on the substrate SUB. For example, the first pass transistors PT_A may be disposed in a first pass transistor region PTR_1 of the substrate SUB, and the second pass transistors PT_B may be disposed in a second pass transistor region PTR_2 of the substrate SUB. The first pass transistor region PTR_1 may overlap the first word line contact region WLCR_1, and the second pass transistor region PTR_2 may overlap the second word line contact region WLCR_2.

The first pass transistors PT_A and the second pass transistors PT_B may be the first pass transistors PT_A and the second pass transistors PT_B of FIG. 5. The first pass transistors PT_A and the second pass transistors PT_B may be provided between the substrate SUB and the first insulating layer IP0. The first pass transistors PT_A and the second pass transistors PT_B may be covered with the first insulating layer IP0. Each of the first pass transistors PT_A and the second pass transistors PT_B may include a first impurity region J1, a second impurity region J2, a gate insulating layer GI, and a gate GA. The first impurity region J1 and the second impurity region J2 may be formed by doping the substrate SUB with impurities. The first impurity region J1 may be electrically connected to any one of the global word lines GWL<0> to GWL<n> of FIG. 5, and the second impurity region J2 may be electrically connected to any one of the local lines LL<0> to LL<n> of FIG. 5. The gate insulating layer GI and the gate GA may be arranged to be sequentially stacked on the substrate SUB between the first impurity region J1 and the second impurity region J2. The first impurity region J1 and the second impurity region J2 may be portions of the substrate SUB.

A first line ML1 may be disposed on the first pass transistors PT_A, and may be a line corresponding to the block select line BLKWL of FIG. 5. The gate GA of the first pass transistors PT_A and the first line ML1 may be coupled to each other through a first contact CT1, and the first line ML1 may be coupled to a second line ML2 disposed over the first line ML1 through a second contact CT2. The first contact CT1, the first line ML1, the second contact CT2, and the second line ML2 may be covered with the first insulating layer IP0.

A first line ML1 and a second line ML2 may be disposed on the second pass transistors PT_B, the gate GA of the second pass transistors PT_B and the first line ML1 may be coupled to each other through a first contact CT1, and the first line ML1 may be coupled to a second line ML2 disposed over the first line ML1 through a second contact CT2. The first contact CT1, the first line ML1, the second contact CT2, and the second line ML2 may be covered with the first insulating layer IP0.

Each of the first contact CT1, the first line ML1, the second contact CT2, and the second line ML2 may include a conductive material. In an example, each of the first contact CT1, the first line ML1, the second contact CT2, and the second line ML2 may include copper, tungsten or aluminum.

Although not illustrated in the drawing, a transistor, a resistor, and a capacitor may be further provided in the first insulating layer IP0. The transistor, the resistor, and the capacitor may be used as elements of a peripheral circuit including a row decoder, a column decoder, a page buffer circuit, and an input/output circuit.

A source structure SLS may be provided on the first insulating layer IP0. The source structure SLS may be used as the source line SL of FIG. 5. The source structure SLS may include a conductive material. In an example, the source structure SLS may include doped polysilicon. The source structure SLS may be a single-layer structure or a multi-layer structure.

A first stacked body STS1 may be provided on the source structure SLS.

The first stacked body STS1 may be disposed in the cell region CR and the first and second word line contact regions WLCR_1 and WLCR_2. The first stacked body STS1 may include first insulating patterns IP1 and conductive lines CL that are alternately stacked.

The first insulating patterns IP1 may include an insulating material. For example, the first insulating patterns IP1 may include oxide. The conductive lines CL may include a conductive material. For example, the conductive lines CL may include at least one of a doped silicon layer, a metal silicide layer, tungsten, nickel, and cobalt. The conductive lines CL may be used as word lines coupled to memory cells, drain and source select lines coupled to a drain select transistor and a source select transistor, and a block select line. For example, at least one conductive line CL disposed in a lowermost portion may be the source select line, at least one conductive line CL disposed in an uppermost portion may be the drain select line, a plurality of conductive lines CL disposed between the source select line and the drain select line may be the word lines, and one conductive line CL disposed between the source select line and the word lines may be the block select line BLKWL of FIG. 5. In an embodiment of the present disclosure, although the block select line is described as being a conductive line adjacent to the source select line, the present disclosure is not limited thereto, and at least one conductive line among the plurality of conductive lines CL may be used as the block select line.

The first insulating patterns IP1 and the conductive lines CL that are included in the first stacked body STS1 may be disposed to extend from the cell region CR to the first word line contact region WLCR_1 and the second word line contact region WLCR_2.

Cell plugs CP penetrating the first stacked body STS1 may be provided. For example, the cell plugs CP may penetrate the first insulating patterns IP1 and the conductive lines CL of the first stacked body STS1 in the cell region CR. The cell plugs CP may extend in a direction vertical to the substrate SUB in the first stacked body STS1 of the cell region CR, and may extend into the source structure SLS under the first stacked body STS1.

Each of the cell plugs CP may include a channel layer CH penetrating the first stacked body STS1 and a memory layer ML enclosing the channel layer CH. The channel layer CH may include a semiconductor material. For example, the channel layer CH may include polysilicon. The memory layer ML may include multiple insulating layers.

The memory layer ML may include a tunnel layer enclosing the channel layer CH, a storage layer enclosing the tunnel layer, and a blocking layer enclosing the storage layer. The tunnel layer may include an insulating material that enables charge tunneling. For example, the tunnel layer may include oxide. In an embodiment, the storage layer may include a material capable of trapping charges. For example, the storage layer may include at least one of nitride, silicon, a phase-change material, and nanodots. In an embodiment, the blocking layer may include an insulating material capable of blocking the movement of charges. For example, the blocking layer may include oxide. In an embodiment, the thickness of the tunnel layer may be less than that of the blocking layer.

Apart from the configuration illustrated in the drawing, each of the cell plugs CP may further include a filling layer in the channel layer CH. The filling layer may include an insulating material. For example, the filling layer may include oxide.

The memory layer ML may be formed to expose a partial lower portion of the channel layer CH, and the exposed partial lower portion of the channel layer CH may be electrically connected to the source structure SLS while contacting the source structure SLS.

In each of the cell plugs CP, portions enclosed by the conductive lines CL used as word lines are defined as the memory cells (e.g., MC0 to MCn of FIG. 5), and a portion enclosed by the conductive line CL used as the block select line may be defined as a dummy cell (e.g., DC of FIG. 5).

A source select line contact SSL_C, a block select line contact BLKWL_C, first word line contacts WLC_A, a drain select line contact DSL_C, and second word line contacts WLC_B, which penetrate the first stacked body STS1, may be provided.

For example, in the first word line contact region WLCR_1, the source select line contact SSL_C, the block select line contact BLKWL_C, and the first word line contacts WLC_A may be disposed to extend into the first stacked body STS1 in a direction vertical to the substrate SUB. Further, in the second word line contact region WLCR_2, the block select line contact BLKWL_C and the second word line contacts WLC_B may be disposed to extend into the first stacked body STS1 in the direction vertical to the substrate SUB. Each of the source select line contact SSL_C, the block select line contact BLKWL_C, the first word line contacts WLC_A, the drain select line contact DSL_C, and the second word line contacts WLC_B may be electrically connected to the conductive lines CL corresponding thereto.

The source select line contact SSL_C, the block select line contact BLKWL_C, the first word line contacts WLC_A, the drain select line contact DSL_C, and the second word line contacts WLC_B may extend into the first insulating layer IP0 after penetrating the source structure SLS disposed under the first stacked body STS1.

The source select line contact SSL_C, the block select line contact BLKWL_C, the first word line contacts WLC_A, the drain select line contact DSL_C, and the second word line contacts WLC_B may be coupled to the second lines ML2 in the first insulating layer IP0. The block select line contact BLKWL_C may be electrically connected to the first line ML1 corresponding to the block select line BLKWL of FIG. 5 through the second line ML2 and the second contact CT2 corresponding thereto. The first word line contacts WLC_A may be coupled to the second impurity regions J2 of the first pass transistors PT_A through the second lines ML2. The second word line contacts WLC_B may be coupled to the second impurity regions J2 of the second pass transistors PT_B through the second lines ML2.

Spacer layers SP may be formed on the sidewalls of the source select line contact SSL_C, the block select line contact BLKWL_C, the first word line contacts WLC_A, the drain select line contact DSL_C, and the second word line contacts WLC_B. The spacer layers SP may electrically and physically isolate the source select line contact SSL_C, the block select line contact BLKWL_C, the first word line contacts WLC_A, the drain select line contact DSL_C, and the second word line contacts WLC_B from the source structure SLS. Further, each of the source select line contact SSL_C, the block select line contact BLKWL_C, the first word line contacts WLC_A, the drain select line contact DSL_C, and the second word line contacts WLC_B may be electrically and physically isolated from the conductive lines CL which do not correspond thereto, through the corresponding spacer layer SP.

Figure 11:
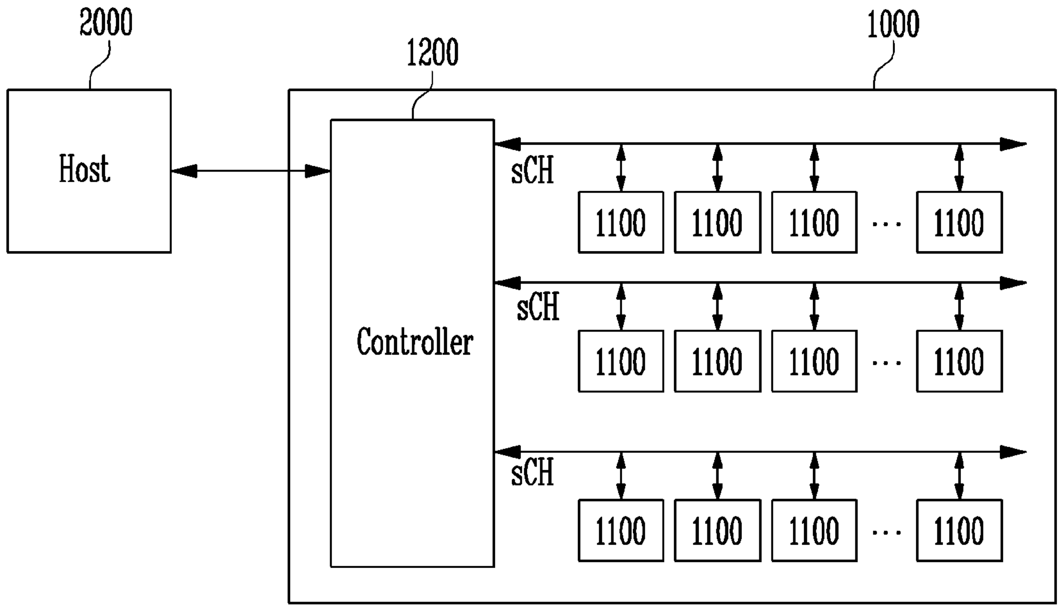
FIG. 11 is a diagram illustrating an embodiment of a memory system including a semiconductor memory device according to an embodiment of the present disclosure.

FIG. 11 is a diagram illustrating an embodiment of a memory system including a semiconductor memory device according to an embodiment of the present disclosure.

Referring to FIG. 11, a memory system 1000 may include a plurality of semiconductor memory devices 1100 which store data, and a controller 1200 which performs communication between the semiconductor memory devices 1100 and a host 2000.

Each of the semiconductor memory devices 1100 may be a semiconductor memory device, described in the foregoing embodiments.

The semiconductor memory devices 1100 may be coupled to the controller 1200 through a plurality of system channels sCH. For example, the plurality of semiconductor memory devices 1100 may be coupled to one system channel sCH, and the plurality of system channels sCH may be coupled to the controller 1200.

The controller 1200 may perform communication between the host 2000 and the semiconductor memory devices 1100. In an embodiment, the controller 1200 may control the semiconductor memory devices 1100 in response to a request from the host 2000, or may perform a background operation for improving the performance of the memory system 1000 regardless of whether a request is received from the host 2000.

The host 2000 may generate requests for various operations, and may output the generated requests to the memory system 1000. For example, the requests may include a program request for controlling a program operation, a read request for controlling a read operation, an erase request for controlling an erase operation, etc. The host 2000 may communicate with the memory system 1000 through various interfaces, such as peripheral component interconnect express (PCIe), advanced technology attachment (ATA), serial ATA (SATA), parallel ATA (PATA), serial attached SCSI (SAS), non-volatile memory express (NVMe), universal serial bus (USB), multi-media card (MMC), enhanced small device interface (ESDI), or integrated drive electronics (IDE).

According to an embodiment of the present disclosure, it is possible to apply operating voltages through both ends of conductive lines for word lines by placing pass transistors at both ends of a cell region, thus minimizing the occurrence of differences in word line loading depending on the positions of memory cells.

What is claimed is:

1. A semiconductor memory device, comprising:

a stacked body comprising a plurality of conductive lines; and first pass transistors and second pass transistors configured to couple global word lines to local lines, wherein any one of the plurality of conductive lines is a block select line, and gates of the first pass transistors and the second pass transistors are coupled to the block select line.

2. The semiconductor memory device according to claim 1, further comprising:

a plurality of cell plugs extending in a direction vertical to a substrate in the stacked body.

3. The semiconductor memory device according to claim 2, wherein both ends of the stacked body correspond to a first slimming region and a second slimming region in which the plurality of conductive lines have a stepped structure.

4. The semiconductor memory device according to claim 3, wherein the first pass transistors are disposed under the first slimming region and the second pass transistors are disposed under the second slimming region.

5. The semiconductor memory device according to claim 3, further comprising:

a plurality of first word line contacts and a first block select line contact coupled to the plurality of conductive lines, respectively, in the first slimming region, wherein the first block select line contact and the plurality of first word line contacts extend in a direction vertical to the substrate.

6. The semiconductor memory device according to claim 5, further comprising:

a plurality of second word line contacts and a second block select line contact coupled to the plurality of conductive lines, respectively, in the second slimming region, wherein the second block select line contact and the plurality of second word line contacts extend in the direction vertical to the substrate.

7. The semiconductor memory device according to claim 6, wherein each of the plurality of conductive lines is coupled to any one of the plurality of first word line contacts and the first block select line contact in the first slimming region, and is coupled to any one of the plurality of second word line contacts and the second block select line contact in the second slimming region.

8. The semiconductor memory device according to claim 1, wherein the plurality of conductive lines are a plurality of word lines, a plurality of select lines, and the block select line, respectively.

9. The semiconductor memory device according to claim 8, wherein the block select line is disposed adjacent to any one of the select lines.

10. The semiconductor memory device according to claim 2, wherein:

each of the plurality of cell plugs includes a plurality of memory cells, a plurality of select transistors, and a dummy cell, and a gate of the dummy cell is coupled to the block select line.

11. A semiconductor memory device, comprising:

a stacked body including a plurality of conductive lines, and including a stepped structure at a first end and a second end of the stacked body;

first pass transistors and second pass transistors configured to couple global word lines to local lines;

a plurality of first word line contacts and a first block select line contact that are respectively coupled at the first end to conductive lines of a first group, among the plurality of conductive lines, and that extend in a direction vertical to a substrate; and a plurality of second word line contacts and a second block select line contact that are respectively coupled at the second end to conductive lines of a second group, among the plurality of conductive lines, and that extend in the direction vertical to the substrate, wherein any one of the plurality of conductive lines is a block select line, and gates of the first pass transistors and the second pass transistors are coupled to the block select line.

12. The semiconductor memory device according to claim 11, wherein the first group includes odd-numbered conductive lines among the plurality of conductive lines, and the second group includes even-numbered conductive lines among the plurality of conductive lines.

13. The semiconductor memory device according to claim 11, wherein the first group includes conductive lines disposed in an upper portion among the plurality of conductive lines, and the second group includes conductive lines disposed under the first group.

14. The semiconductor memory device according to claim 11, wherein:

the first pass transistors are disposed under the plurality of first word line contacts and the first block select line contact, and the second pass transistors are disposed under the plurality of second word line contacts and the second block select line contact.

15. The semiconductor memory device according to claim 11, wherein the plurality of conductive lines are a plurality of word lines, a plurality of select lines, and the block select line, respectively.

16. The semiconductor memory device according to claim 15, wherein the block select line is disposed adjacent to any one of the select lines.

17. The semiconductor memory device according to claim 11, further comprising:

a plurality of cell plugs extending in a direction vertical to the substrate in the stacked body.

18. The semiconductor memory device according to claim 17, wherein:

each of the plurality of cell plugs includes a plurality of memory cells, a plurality of select transistors, and a dummy cell, and a gate of the dummy cell is coupled to the block select line.

19. A semiconductor memory device, comprising:

a memory block including a plurality of memory strings, each of the memory strings comprising a drain select transistor, a plurality of memory cells, a dummy cell, and a source select transistor;

first pass transistors disposed on a first side of the memory block, and configured to couple global word lines to local word lines coupled to gates of the plurality of memory cells; and second pass transistors disposed on a second side of the memory block and configured to couple the global word lines to the local word lines, wherein gates of the first pass transistors and the second pass transistors are coupled to one block select line.

20. The semiconductor memory device according to claim 19, wherein the one block select line is coupled to a gate of the dummy cell.

* * * * *